(12) United States Patent
Sadler

(10) Patent No.: US 11,540,433 B2
(45) Date of Patent: Dec. 27, 2022

(54) SHIELDING MATERIAL FOR ELECTROMAGNETIC PULSE PROTECTION

(71) Applicant: Lawrence R. Sadler, Palmetto, FL (US)

(72) Inventor: Lawrence R. Sadler, Palmetto, FL (US)

(*) Notice: Subject to any disclaimer, the term of this patent is extended or adjusted under 35 U.S.C. 154(b) by 0 days.

(21) Appl. No.: 17/192,821

(22) Filed: Mar. 4, 2021

(65) Prior Publication Data

US 2021/0282303 A1    Sep. 9, 2021

Related U.S. Application Data

(60) Provisional application No. 62/985,138, filed on Mar. 4, 2020.

(51) Int. Cl.
*H05K 9/00* (2006.01)

(52) U.S. Cl.
CPC ......... *H05K 9/0088* (2013.01); *H05K 9/0003* (2013.01)

(58) Field of Classification Search
CPC ............................ H05K 9/0003; H05K 9/0088
See application file for complete search history.

(56) References Cited

U.S. PATENT DOCUMENTS

| | | | |
|---|---|---|---|
| 3,260,788 A * | 7/1966 | Stetson | H05K 9/0015 174/374 |
| 10,034,418 B1 | 7/2018 | Tuan et al. | |
| 2014/0008119 A1 | 1/2014 | Brandt | |
| 2016/0278249 A1 * | 9/2016 | Lucignano | H05K 9/009 |
| 2019/0032392 A1 | 1/2019 | Cordes | |
| 2019/0269045 A1 | 8/2019 | Carroll et al. | |

FOREIGN PATENT DOCUMENTS

| | | | | |
|---|---|---|---|---|
| ES | WO 02/093995 | * | 11/2002 | H05K 9/0001 |
| KR | 20150109151 A | | 10/2015 | |
| WO | 2017172939 A1 | | 10/2017 | |

OTHER PUBLICATIONS

Machine Translation for KR 20150109151, translated on May 26, 2022, 11 pages of description. (Year: 2022).*
PCT/US2021/020957, "Notification of Transmittal of the International Search Report and the Written Opinion of the International Searching Authority, or the Declaration", PCT, dated Jun. 2, 2021, pp. 1-14.

* cited by examiner

*Primary Examiner* — Hung V Ngo
(74) *Attorney, Agent, or Firm* — Kunzler Bean & Adamson

(57) ABSTRACT

Apparatuses, systems, and methods are disclosed for electromagnetic pulse ("EMP") shielding. An enclosure may include a plurality of sheets of structural EMP shielding material disposed to enclose a space, and one or more EMP shielding connectors to bridge gaps between the sheets of structural EMP shielding material. The sheets of structural EMP shielding material may individually include a first set of alternating layers of ferrous metal and non-ferrous metal, a second set of alternating layers of ferrous metal and non-ferrous metal, and an electrically non-conductive layer disposed between the first set of alternating layers and the second set of alternating layers. The one or more EMP shielding connectors may individually include at least one layer of ferrous metal, at least one layer of non-ferrous metal, and a bonding material for bonding to the sheets of structural EMP shielding material.

10 Claims, 4 Drawing Sheets

SHIELDING MATERIAL FOR ELECTROMAGNETIC PULSE PROTECTION

CROSS-REFERENCES TO RELATED APPLICATIONS

This application claims the benefit of U.S. Provisional Patent Application No. 62/985,138 entitled "Magna Shield" and filed on Mar. 4, 2020 for Lawrence Sadler, which is incorporated herein by reference.

FIELD

This invention relates to electromagnetic pulse protection and more particularly relates to shielding materials for electromagnetic pulse protection.

BACKGROUND

Various types of shielding such as Faraday cages exist for shielding devices or components from electric, magnetic, and/or electromagnetic fields. However, various types of shielding may not provide sufficient protection from higher-energy events such as an electromagnetic pulse.

SUMMARY

Apparatuses are disclosed for electromagnetic pulse ("EMP") shielding. In one embodiment, an apparatus includes a first set of alternating layers of ferrous metal and non-ferrous metal, a second set of alternating layers of ferrous metal and non-ferrous metal, and an electrically non-conductive layer disposed between the first set of alternating layers and the second set of alternating layers.

Enclosures are disclosed for EMP shielding. In one embodiment, an enclosure includes a plurality of sheets of structural EMP shielding material disposed to enclose a space, and one or more EMP shielding connectors to bridge gaps between the sheets of structural EMP shielding material. The sheets of structural EMP shielding material may individually include a first set of alternating layers of ferrous metal and non-ferrous metal, a second set of alternating layers of ferrous metal and non-ferrous metal, and an electrically non-conductive layer disposed between the first set of alternating layers and the second set of alternating layers. The one or more EMP shielding connectors may individually include at least one layer of ferrous metal, at least one layer of non-ferrous metal, and a bonding material for bonding to the sheets of structural EMP shielding material.

Methods are disclosed for EMP shielding. A method, in one embodiment, includes providing a plurality of sheets of structural EMP shielding material. The sheets of structural EMP shielding material may individually include a first set of alternating layers of ferrous metal and non-ferrous metal, a second set of alternating layers of ferrous metal and non-ferrous metal, and an electrically non-conductive layer disposed between the first set of alternating layers and the second set of alternating layers. In a further embodiment, a method includes providing one or more EMP shielding connectors. The one or more EMP shielding connectors may individually include at least one layer of ferrous metal, at least one layer of non-ferrous metal, and a bonding material for bonding to the sheets of structural EMP shielding material. In one embodiment, a method includes disposing the sheets of structural EMP shielding material to enclose a space. In a further embodiment, a method includes coupling the EMP shielding connectors to the sheets of structural EMP shielding material to bridge gaps between the sheets of structural EMP shielding material.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
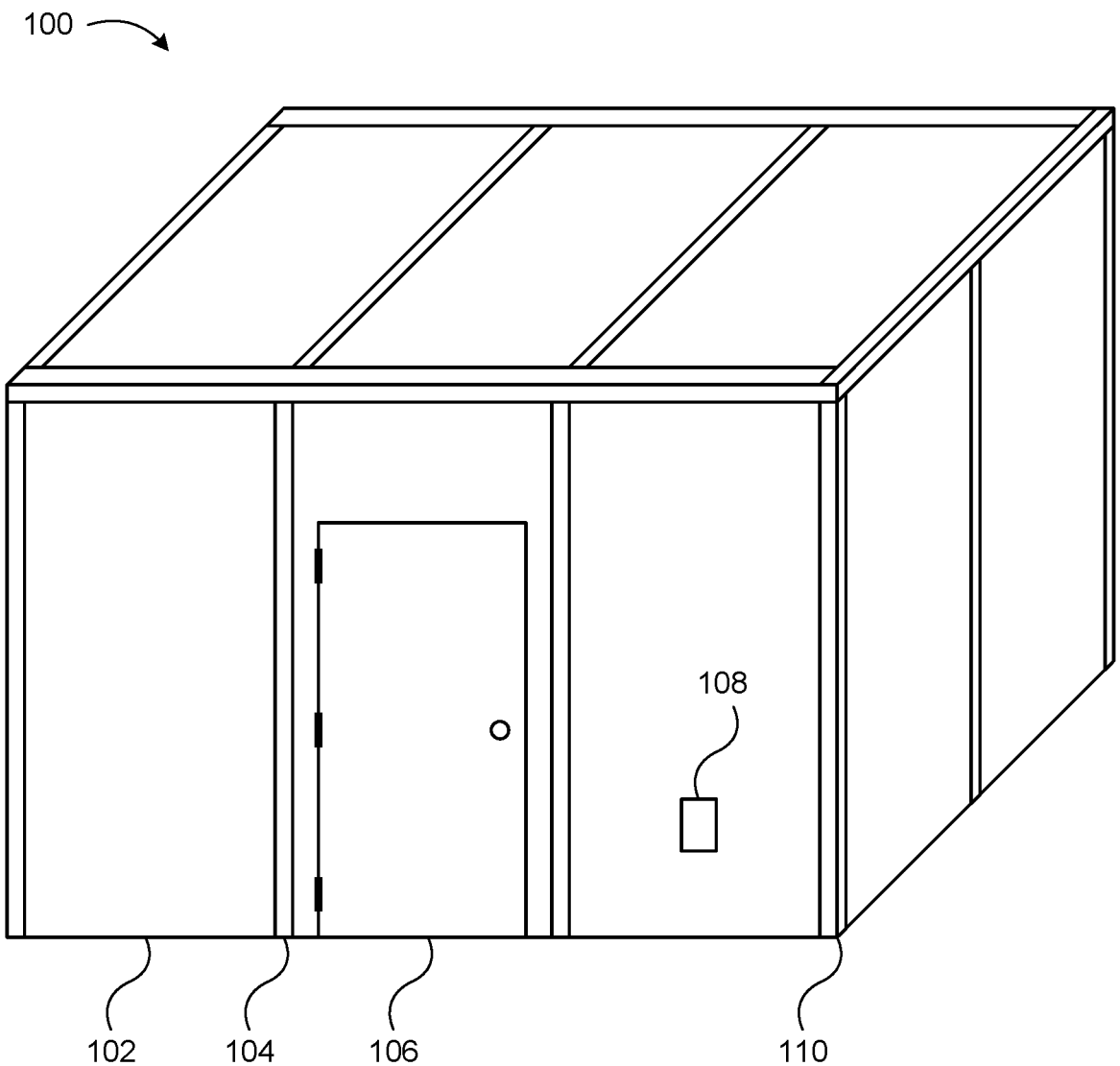
FIG. 1 is a perspective view illustrating one embodiment of an enclosure for electromagnetic pulse ("EMP") shielding.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are included to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

Figure 2:
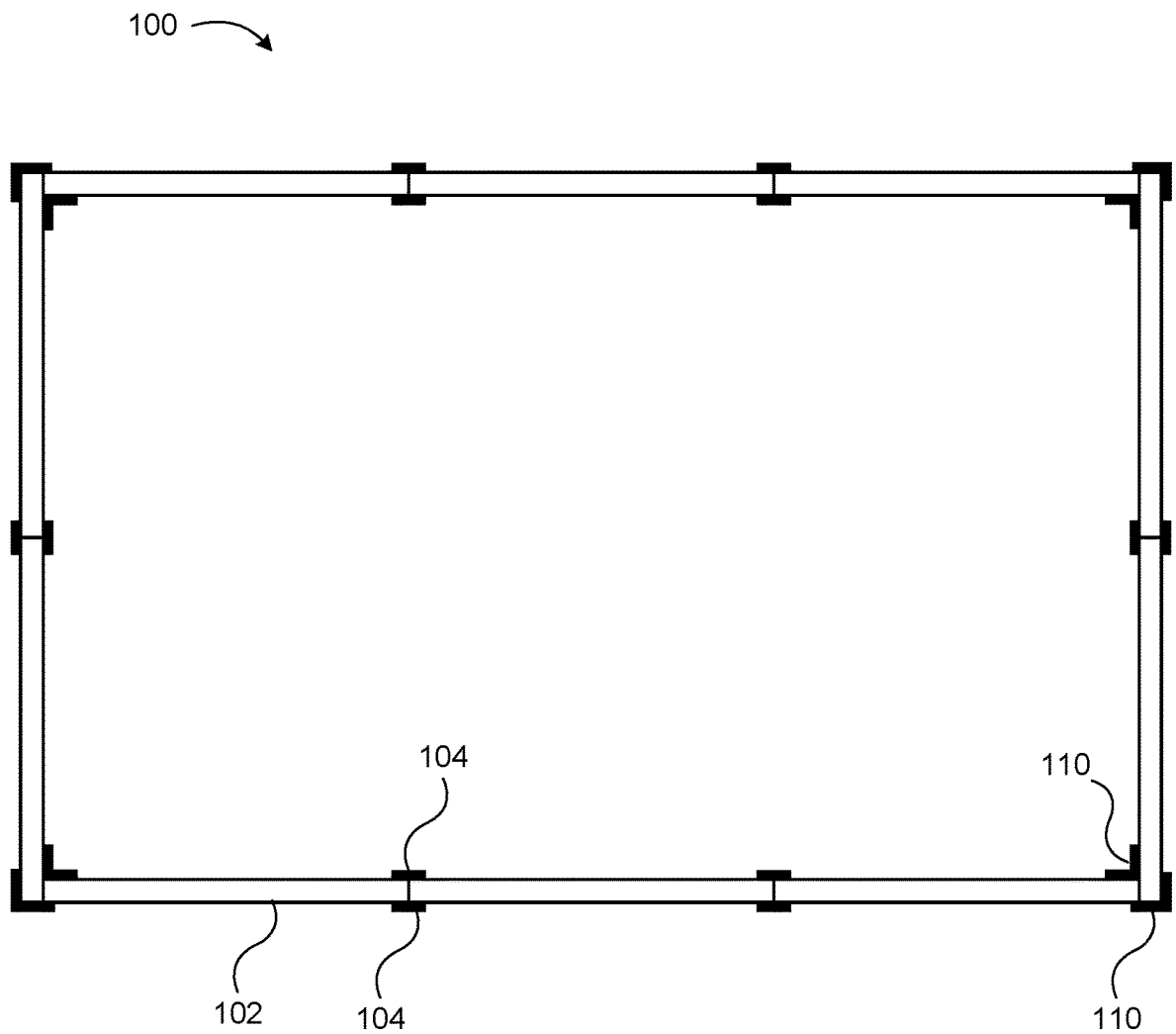
FIG. 2 is a plan view further illustrating the enclosure of FIG. 1.

FIGS. 1 and 2 depict one embodiment of an enclosure 100 for electromagnetic pulse ("EMP") shielding. FIG. 1 depicts a perspective view and FIG. 2 depicts a plan view with roof components removed so that wall components are visible.

EMPs may be produced by natural events such as solar flares or by malicious actors. For example, a high-altitude nuclear explosion may create a high-altitude EMP ("HEMP"). In either case, a high-energy EMP may damage important electrical and/or electronic equipment, such as power generation or switching equipment, communications equipment, computer equipment, or the like. In various embodiments, an enclosure 100 for EMP shielding may be useful to protect such equipment inside the enclosure 100 from EMPs. Additionally, some EMPs are human created for non-malicious purposes such as physics research. An enclosure 100 may be useful to separate EMP-producing equipment from EMP-sensitive equipment. In further embodiments, an enclosure 100 for EMP shielding may also provide effective shielding from static magnetic fields, static electric fields, electromagnetic waves such as radio waves, microwaves, and X-rays, or the like.

In various embodiments, an enclosure 100 for EMP shielding may include a plurality of sheets of EMP shielding material 102, disposed to enclose a space. In further embodiments, the enclosure 100 may include one or more EMP shielding connectors 104, 110 to bridge gaps between the sheets of EMP shielding material 102. EMP shielding material 102 and EMP shielding connectors 104, 110, in various embodiments, may be capable of shielding equipment within the enclosure 100 from electromagnetic pulses. Construction of the sheets of EMP shielding material 102 and the EMP shielding connectors 104, 110 is described in further detail below with reference to subsequent Figures.

An enclosure 100, in some embodiments, may be a permanent (e.g., durable or long-lasting) building, such as a power substation. In some embodiments, an enclosure 100 may be a mobile or field-assembled building. For example, an enclosure 100 may be a sensitive compartmented information facility (SCIF) to shield electronic data and communications equipment inside the SCIF from harmful EMPs, and to prevent detection from outside the SCIF of electromagnetic signals generated inside the SCIF. A portable SCIF may be an enclosure 100 on a truck or trailer, or may be a field-assembled building, where the sheets of EMP shielding material 102 and the EMP shielding connectors 104, 110 are transported to a field location and rapidly assembled.

To form an enclosure 100, sheets of EMP shielding material 102 are disposed to enclose a space. In the depicted embodiment, the space within the enclosure 100 is fully enclosed by sheets of EMP shielding material 102 forming four walls and a roof. (In some embodiments, a floor of an enclosure may also be formed by EMP-shielding material.) A fully enclosed space may be accessed via a door 106, which may be covered in EMP shielding material. One or more openings 108 may be provided (e.g., in walls of a portable or field-assembled enclosure 100, in the floor of a permanent enclosure 100, or the like), to bring utilities such as electrical cables, ventilation ducts, or the like, inside the enclosure. Such openings may be surrounded by smaller panels of EMP shielding material 102, in some embodiments.

In another embodiment, sheets of EMP shielding material 102 may be disposed to partially surround or enclose a space, and the partially enclosed space may still be referred to as being "enclosed" by the EMP shielding material 102, with the resulting structure being referred to as an "enclosure." For example, in some embodiments, three sheets of EMP shielding material 102 may be disposed to form a roughly C-shaped booth, with three walls and no roof, which may be sufficient to provide a desired level of shielding (e.g., between interference-producing equipment inside a room where the booth is placed, and interference-sensitive equipment inside the booth). Such a booth may still be referred to as an "enclosure" despite not being fully enclosed.

Sheets of EMP shielding material 102 may be substantially flat panels of various sizes. For example, in an embodiment where an enclosure 100 is a building, sheets of EMP shielding material 102 may be produced in sizes comparable to sheets of drywall or oriented strand board (OSB) sheathing, such as in 4' by 8', 4' by 10' and/or 4' by 12' sizes. As another example, in an embodiment where an enclosure 100 is for shielding a computer, sheets of EMP shielding material 102 may be produced in sizes comparable to comparable to the size of the front, top, and sides of a computer case. In some embodiments, smaller sheets of EMP shielding material 102 may be cut from larger sheets. Additionally, in some embodiments, EMP shielding material 102 may be molded or stamped to form three-dimensional structures rather than sheets.

In some embodiments, an enclosure 100 may include support structure other than the sheets of EMP shielding material 102. For example, vertical sheets of EMP shielding material 102 for the walls of the enclosure 100 may be attached (e.g., glued with construction adhesive) to support structure such as a concrete or masonry wall, wooden or metal studs, or the like. In some embodiments, however, sheets of EMP shielding material 102 may include an inner substrate and/or one or more outer substrates (as described below), which may provide sufficient rigidity so that the sheets of EMP shielding material 102 are connectable by the EMP shielding connectors 104, 110 to form a free-standing enclosure 100, without attaching the sheets of EMP shielding material 102 to another wall. EMP shielding material that includes such a substrate may be referred to as "structural" EMP shielding material 102. In some embodiments, sheets of structural EMP shielding material 102 may be useful for forming free-standing structures, but may be significantly heavier than sheets of non-structural EMP shielding material 102, which may be added to existing structures without adding the full weight of structural EMP shielding material 102.

When sheets of EMP shielding material 102 are disposed to enclose a space, gaps between sheets may allow for transmission rather than attenuation/shielding of EMPs and other electromagnetic waves. For example, gaps may exist between the edges of two adjacent sheets that are co-planar to each other in the same wall, and corner gaps may exist between sheets in adjacent walls. Thus, in various embodiments, EMP shielding connectors 104, 110, may be coupled to the sheets of EMP shielding material 102, to bridge (and shield) gaps between the sheets. In the depicted embodiment, flat connectors 104 bridge gaps between co-planar sheets of EMP shielding material 102 (e.g., two sheets in the same wall, and angled connectors 110 bridge corner gaps. Referring to the plan view of FIG. 2, the enclosure 100 in the depicted embodiment includes EMP shielding connectors 104, 110 to bridge gaps between sheets on both the interior and the exterior. In another embodiment, an enclosure 100 may include EMP shielding connectors 104, 110 on one side of the gaps between sheets of EMP shielding material 102, rather than on both sides of the gaps.

Construction of the sheets of EMP shielding material 102 and the EMP shielding connectors 104, 110 is described in further detail below with reference to subsequent Figures. Thicknesses of various materials and components are not depicted to scale in the Figures, to more clearly show the relation of materials to other materials and components. For example, in FIG. 2, the sheets of structural EMP shielding material 102 may be 4' wide, 8' tall, and approximately ⅝" to ¾" thick, but the thickness of the sheets 102 is depicted as substantially larger, proportionate to the width, so that the gaps between sheets 102 may more clearly be seen. Also, the EMP shielding connectors 104, 110 may be thinner than the sheets of EMP shielding material 102 but are depicted as thick lines so that they may be clearly seen in the plan view. Similarly, in FIGS. 3-9, layers of materials that form the sheets of EMP shielding material and EMP shielding connectors 104, 110 are depicted without attempting to accurately depict the relative thicknesses of each layer; and even extremely thin layers may be depicted with some greater thickness for greater ease in showing which layers are formed from which materials, and how the layers are arranged.

Figure 3:
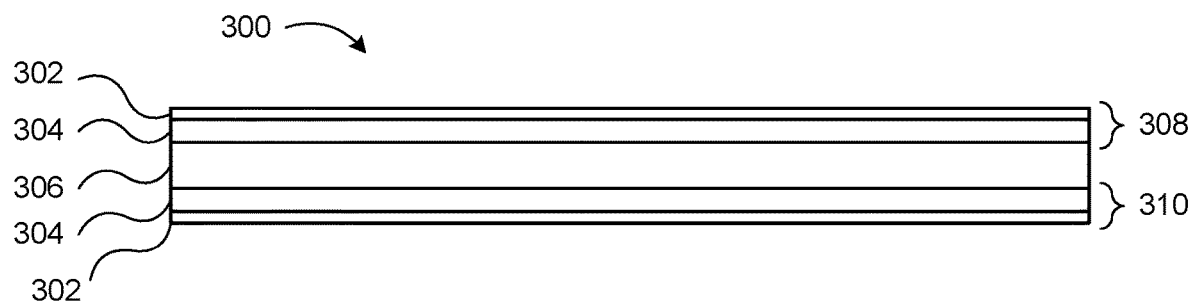
FIG. 3 is a side view illustrating one embodiment of EMP shielding material.

FIG. 3 is a side view illustrating one embodiment of EMP shielding material 300. The EMP shielding material 300 in the depicted embodiment, may form a sheet of EMP shielding material 102 as described above with reference to FIG. 1. In the depicted embodiment, the EMP shielding material 300 includes a first set 308 of alternating layers of ferrous metal 304 and non-ferrous metal 302, a second set 310 of alternating layers of ferrous metal 304 and non-ferrous metal 302, and an electrically non-conductive layer 306 disposed between the first set 308 of alternating layers and the second set 310 of alternating layers.

Ferrous metal 304, in various embodiments, may refer to any ferromagnetic metal. Ferrous metal 304 may be electrically conductive, and may have a magnetic permeability ($\mu$) substantially greater than the vacuum permeability ($\mu_0$). For example, the relative permeability ($\mu/\mu_0$) of ferrous metal 304 may be above 40, in a range from 100 to several hundred, in a range from 1000 to several thousand, or more. Non-ferrous metal 302, in various embodiment, may be metal that is not ferromagnetic. Non-ferrous metal 302 may be electrically conductive and may have a relative magnetic permeability ($\mu/\mu_0$) of approximately 1.

A "set" 308, 310 of alternating ferrous and non-ferrous layers, in various embodiments, includes at least one layer of ferrous metal 304, and at least one layer of non-ferrous metal 302. Thus, in the depicted embodiment, each set 308, 310 of alternating ferrous and non-ferrous layers includes one layer of ferrous metal 304, and one layer of non-ferrous metal 302. In another embodiment, a set 308, 310 of alternating ferrous and non-ferrous layers may include more than two layers, alternating between ferrous metal 304 and non-ferrous metal 302. For example, a set 308, 310 of alternating ferrous and non-ferrous layers may include 4 layers, 6 layers, 8 layers, an odd number of layers (e.g., with one more layer of ferrous metal 304 than of non-ferrous metal 302), or the like.

The ferrous metal 304, in some embodiments, may be sheet steel, such as cold rolled steel or galvanized sheet steel. Using galvanized steel may add weight but provide corrosion protection. In some embodiments, the ferrous metal 304 may be 18-gauge galvanized sheet steel, 20-gauge galvanized sheet steel, 22-gauge galvanized sheet steel, or other galvanized or ungalvanized sheet steel with a thickness in a range from 12-28 gauge. Use of thicker ferrous metal 304 may add weight but improve effectiveness of the EMP shielding, while thinner ferrous metal 304 may provide more lightweight shielding with lower shielding effectiveness. Lower shielding effectiveness may be suitable for enclosures 100 where a high degree of shielding is not needed, or where some shielding is provided by other materials (e.g., by concrete walls).

The non-ferrous metal 302, in some embodiments may be an electrically conductive but nonferromagnetic metal such as aluminum or copper. In some embodiments, the non-ferrous metal 302 may be aluminum sheet metal with a thickness in a range from 18-28 gauge. In some embodiments, the non-ferrous metal 302 may be aluminum foil, copper foil, or the like.

In some embodiments, the ferrous metal 304 and/or the non-ferrous metal 302 may be perforated metal, such as a metal mesh, a metal screen, sheet metal with slots or holes, or the like. The use of perforated metal may reduce the weight of the EMP shielding 300 compared to using non-perforated metal.

The electrically non-conductive layer 306, in various embodiments, may be any electrically non-conductive material such as wood, foam board, fiberboard, drywall, fiber-reinforced plastic, or the like. A solid material for the electrically non-conductive layer 306 may act as a spacer between the first and second sets 308, 310 of alternating ferrous and non-ferrous layers, and/or as a substrate to support the first and second sets 308, 310. An electrically non-conductive layer 306 or substrate disposed between the first set 308 of alternating layers and the second set 310 of alternating layers may be referred to as an inner substrate. In some embodiments, an inner substrate and/or an outer substrate as described below may be or may include an aramid fiber material such as KEVLAR®, to provide both ballistic and EMP protection.

In another embodiment, however the electrically non-conductive layer 306 may be an air gap. For example, the first and second sets 308, 310 of alternating ferrous and non-ferrous layers may be coupled by small non-conductive spacer blocks or spacer pillars, or may be independently supported by two different substrates, leaving an air gap between the first and second sets 308, 310. In some embodiments, thickness of the electrically non-conductive layer 306 may be in a range from approximately ⅛" to approximately ½".

In certain embodiments, the first set 308 of alternating layers and the second set 310 of alternating layers are both disposed with the ferrous metal 304 in contact with the electrically non-conductive layer 306. In various embodiments, sets 308 of alternating ferrous and non-ferrous layers may include an odd number of layers with outward-facing ferrous metal 304, an odd number of layers with outward-facing non-ferrous metal 302, or an even number of layers with ferrous metal 304 on one face and non-ferrous metal 302 on the opposite face. The applicant has discovered by experimentation that providing sets 308, 310 of alternating layers with the ferrous metal 304 exposed on at least one face, and positioning the sets 308, 310 of alternating layers with the ferrous metal 304 face disposed toward or in contact with the electrically non-conductive layer 306, provides better shielding than if a non-ferrous metal 302 face is disposed toward or in contact with the electrically non-conductive layer 306. However, other configurations with a non-ferrous metal 302 face in contact with the electrically non-conductive layer 306 may provide sufficiently effective shielding in some embodiments.

To make a sheet of EMP shielding material 300, the layers of non-ferrous metal 302, ferrous metal 304, and electrically non-conductive material 306 are provided, and bonded together so that the electrically non-conductive material 306 is bonded between sets 308, 310 of alternating ferrous and non-ferrous layers, as described above. Various adhesives will be recognized by a skilled person as suitable for bonding layers together. In some embodiments, to prevent corrosion and/or delamination, edges of the first set 308 of alternating layers and the second set 310 of alternating layers (and/or of the resulting sheet of EMP shielding material 300) may be sealed with epoxy or another waterproof material. In some embodiments, faces of a sheet of EMP shielding material 300 may also be weatherproofed or waterproofed by bonding a sheet of weatherproofed or waterproofed such as TYVEK® barrier material to the outside of the EMP shielding material 300.

In some embodiments, providing additional layers may improve the shielding effectiveness and/or structural rigidity of the EMP shielding material 300. Various embodiments of EMP shielding material 300 with different or additional layers are described below with reference to subsequent figures.

Figure 4:
FIG. 4 is a side view illustrating another embodiment of EMP shielding material.

FIG. 4 is a side view illustrating another embodiment of EMP shielding material 400. The EMP shielding material 400 in the depicted embodiment, may form a sheet of EMP shielding material 102 as described above with reference to FIG. 1. In the depicted embodiment, the EMP shielding material 400 includes first and second sets 408, 410 of alternating layers of ferrous metal 404 and non-ferrous metal 402, and an electrically non-conductive layer 406, each of which may be substantially as described above with reference to FIG. 3.

Although the embodiment of EMP shielding material 300 depicted in FIG. 3, has one ferrous layer and one non-ferrous layer in each of the sets 308, 310 of alternating layers, some other embodiments of EMP shielding material may include similar sets of alternating layers, where at least one of the sets of alternating layers comprises two ferrous layers and two non-ferrous layers. For example, in the depicted embodiment, the second set 410 of alternating layers includes two layers of ferrous metal 404, alternating with two layers of non-ferrous metal 402. In the depicted embodiment, the first set 408 of alternating layers includes one layer of ferrous metal 404 and one layer of non-ferrous metal 402, as in FIG. 3.

Figure 5:
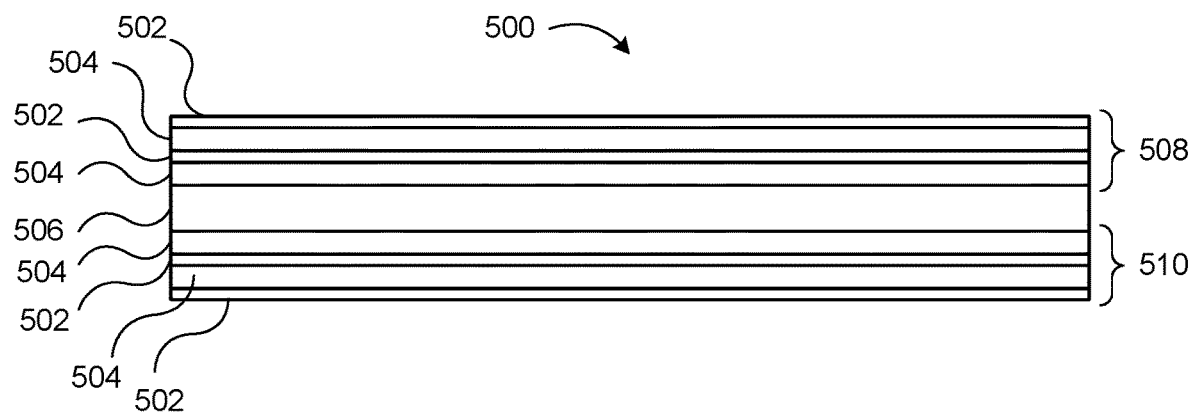
FIG. 5 is a side view illustrating another embodiment of EMP shielding material.

FIG. 5 is a side view illustrating another embodiment of EMP shielding material 500. The EMP shielding material 500 in the depicted embodiment, may form a sheet of EMP shielding material 102 as described above with reference to FIG. 1. In the depicted embodiment, the EMP shielding material 500 includes first and second sets 508, 510 of alternating layers of ferrous metal 504 and non-ferrous metal 502, and an electrically non-conductive layer 506, each of which may be substantially as described above with reference to FIGS. 3 and 4.

Although the embodiment of EMP shielding material 400 depicted in FIG. 4 has two layers of ferrous metal 404 alternating with two layers of non-ferrous metal 402 in only the second set 410 of alternating layers, some other embodiments of EMP shielding material may include similar sets of alternating layers, where both the first set of alternating layers and the second set of alternating layers include two ferrous layers and two non-ferrous layers. For example, in the depicted embodiment, the first and second sets 508, 510 both include two layers of ferrous metal 504, alternating with two layers of non-ferrous metal 502.

Figure 6:
FIG. 6 is a side view illustrating another embodiment of EMP shielding material.

FIG. 6 is a side view illustrating another embodiment of EMP shielding material 600. The EMP shielding material 600 in the depicted embodiment, may form a sheet of EMP shielding material 102 as described above with reference to FIG. 1. In the depicted embodiment, the EMP shielding material 600 includes first and second sets 608, 610 of alternating layers of ferrous metal 604 and non-ferrous metal 602, and an electrically non-conductive layer 606, each of which may be substantially as described above with reference to FIGS. 3 through 5. Additionally, in the depicted embodiment, the EMP shielding material 600 includes an outer substrate 612.

An outer substrate 612, in various embodiments, may be a material bonded to the outside of the EMP shielding material 600, to provide rigidity or increase rigidity of the EMP shielding material 600. In some embodiments, EMP shielding material 600 with an inner substrate for the electrically non-conductive layer 606 and an outer substrate 612 may be more rigid than other embodiments of EMP shielding material, and more suitable for use as structural EMP shielding material. In some embodiments, the outer substrate 612 may be an electrically non-conductive material, such as wood, OSB, fiberboard, structural insulated sheathing (e.g., structural insulation available from OX Engineered Products, LLC, of Pennsylvania), or the like. Although FIG. 6 depicts an outer substrate on one side of the EMP shielding material 600, some embodiments may include outer substrates on both sides of the EMP shielding material 600. Thus, outer substrate(s) 612 may be bonded to one or both sets 608, 610 of alternating layers.

Figure 7:
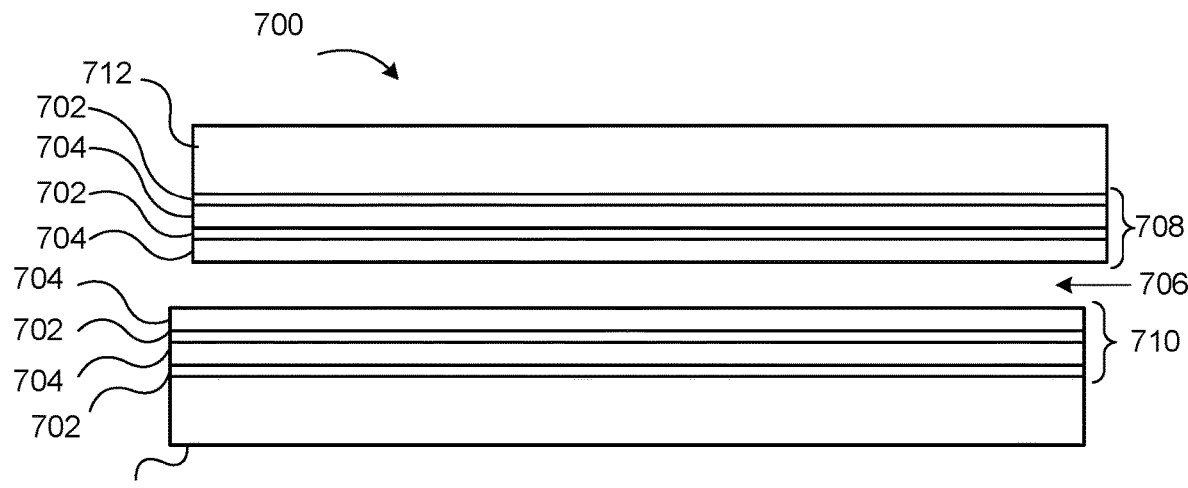
FIG. 7 is a side view illustrating another embodiment of EMP shielding material.

FIG. 7 is a side view illustrating another embodiment of EMP shielding material 700. The EMP shielding material 700 in the depicted embodiment, may form a sheet of EMP shielding material 102 as described above with reference to FIG. 1. In the depicted embodiment, the EMP shielding material 700 includes first and second sets 708, 710 of alternating layers of ferrous metal 704 and non-ferrous metal 702, an electrically non-conductive layer 706, and two outer substrates 712, each of which may be substantially as described above with reference to FIGS. 3 through 6.

In the depicted embodiment, the electrically non-conductive layer 706 is an air gap. Additionally, in this embodiment, an outer substrate 712 is bonded to the first set 708 of alternating layers, and another outer substrate 712 is bonded to the second set 710 of alternating layers. Thus, each set 708, 710 of alternating layers is supported by its own outer substrate 712. In some embodiments, half-panels that include one of alternating layers and one substrate (e.g., the top half of FIG. 7 and the bottom half of FIG. 7) may be transported separately and assembled on opposite sides of an air gap, with spacers used to maintain the distance between half-panels.

Figure 8:
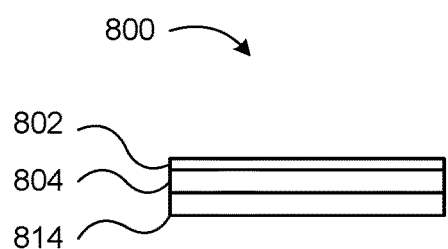
FIG. 8 is a side view illustrating one embodiment of an EMP shielding connector.
Figure 9:
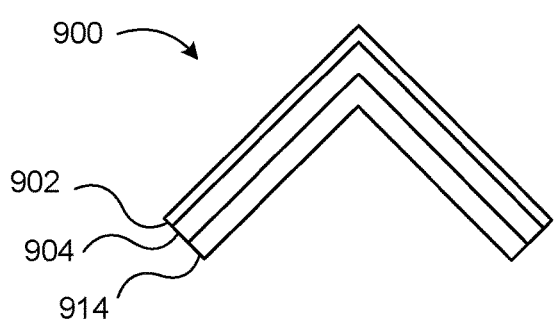
FIG. 9 is a side view illustrating another embodiment of an EMP shielding connector.

FIGS. 8 and 9 illustrate two embodiments of EMP shielding connector 800, 900. The EMP shielding connector 800 depicted in FIG. 8 is a flat connector 104 as described above with reference to FIG. 1, to bridge a gap between co-planar sheets of structural EMP shielding material 102. The EMP shielding connector 900 depicted in FIG. 9 is an angled connector 110 as described above with reference to FIG. 1, to bridge a corner gap between sheets of structural EMP shielding material 102. In the depicted embodiments, EMP shielding connectors 800, 900 each include at least one layer of ferrous metal 804, 904, at least one layer of non-ferrous metal 802, 902, and a bonding material 814, 914 for bonding to sheets of structural EMP shielding material.

The ferrous metal 804, 904 and non-ferrous metal 802, 902 may be substantially as described above for sheets of EMP shielding material. In some embodiments, ferrous metal 904 for an angled connector 900 may be a galvanized steel corner bead for drywall corners. The bonding material 814, 914 may be vinyl strip adhesive, double-sided acrylic adhesive, pressure-sensitive adhesive, or the like. In the depicted embodiment, the flat connector 800 is reversable for use on either side of a gap between co-planar sheets of structural EMP shielding material, and the angled connector 900 includes adhesive on the concave side of the angle, for use on an exterior corner. In another embodiment, an angled connector 900 may have layers reversed, with adhesive on the convex side of the angle, for use on an interior corner.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for electromagnetic pulse ("EMP") shielding, comprising:
   a first set of alternating layers of ferrous metal and non-ferrous metal;
   a second set of alternating layers of ferrous metal and non-ferrous metal; and
   an electrically non-conductive layer disposed between the first set of alternating layers and the second set of alternating layers
   wherein at least one of the first set of alternating layers and the second set of alternating layers comprises two ferrous layers and two non-ferrous layers.

2. An apparatus for electromagnetic pulse ("EMP") shielding, comprising:
   a first set of alternating layers of ferrous metal and non-ferrous metal;
   a second set of alternating layers of ferrous metal and non-ferrous metal; and
   an electrically non-conductive layer disposed between the first set of alternating layers and the second set of alternating layers,
   wherein at least one of the first set of alternating layers and the second set of alternating layers comprises two ferrous layers and two non-ferrous layers, and
   wherein the first set of alternating layers and the second set of alternating layers both individually comprise two ferrous layers and two non-ferrous layers.

3. An apparatus for electromagnetic pulse ("EMP") shielding, comprising:
   a first set of alternating layers of ferrous metal and non-ferrous metal;
   a second set of alternating layers of ferrous metal and non-ferrous metal; and
   an electrically non-conductive layer disposed between the first set of alternating layers and the second set of alternating layers,
   wherein at least one of the first set of alternating layers and the second set of alternating layers comprises two ferrous layers and two non-ferrous layers, and
   wherein the electrically non-conductive layer is an air gap, and
   wherein the apparatus further comprises a first substrate to support the first set of alternating layers and a second substrate to support the second set of alternating layers.

4. An enclosure for electromagnetic pulse ("EMP") shielding, comprising:
   a plurality of sheets of structural EMP shielding material disposed to enclose a space, each of the sheets of structural EMP shielding material individually comprising:
   a first set of alternating layers of ferrous metal and non-ferrous metal;
   a second set of alternating layers of ferrous metal and non-ferrous metal; and
   an electrically non-conductive layer disposed between the first set of alternating layers and the second set of alternating layers; and
   one or more EMP shielding connectors to bridge gaps between the sheets of structural EMP shielding material, each of the one or more EMP shielding connectors individually comprising at least one layer of ferrous metal, at least one layer of non-ferrous metal, and a bonding material for bonding to the sheets of structural EMP shielding material.

5. The enclosure of claim 4, wherein at least one of the one or more EMP shielding connectors is a flat connector to bridge a gap between co-planar sheets of structural EMP shielding material.

6. The enclosure of claim 4, wherein at least one of the one or more EMP shielding connectors is an angled connector to bridge a corner gap between sheets of structural EMP shielding material.

7. The enclosure of claim 4, wherein the ferrous metal is galvanized sheet steel.

8. The enclosure of claim 4, wherein the non-ferrous metal is aluminum foil.

9. The enclosure of claim 4, wherein the electrically non-conductive layer is an inner substrate bonded to the first set of alternating layers and the second set of alternating layers.

10. A method comprising:
- providing a plurality of sheets of structural EMP shielding material, each of the sheets of structural EMP shielding material individually comprising:
  - a first set of alternating layers of ferrous metal and non-ferrous metal;
  - a second set of alternating layers of ferrous metal and non-ferrous metal; and
  - an electrically non-conductive layer disposed between the first set of alternating layers and the second set of alternating layers;
- providing one or more EMP shielding connectors, each of the one or more EMP shielding connectors individually comprising at least one layer of ferrous metal, at least one layer of non-ferrous metal, and a bonding material for bonding to the sheets of structural EMP shielding material;
- disposing the sheets of structural EMP shielding material to enclose a space; and
- coupling the EMP shielding connectors to the sheets of structural EMP shielding material to bridge gaps between the sheets of structural EMP shielding material.

* * * * *